United States Patent [19]
Saka

[11] Patent Number: 6,156,463
[45] Date of Patent: Dec. 5, 2000

[54] METHOD OF DETERMINING THE AMOUNT OF PROJECTION EXPOSURE

[75] Inventor: Kikuo Saka, Takarazuka, Japan

[73] Assignee: Ricoh Company, Ltd., Tokyo, Japan

[21] Appl. No.: 09/251,843

[22] Filed: Feb. 17, 1999

[30] Foreign Application Priority Data

Feb. 18, 1998 [JP] Japan .................................. 10-035777

[51] Int. Cl.⁷ ....................................................... G03F 9/00
[52] U.S. Cl. .............................................. 430/30; 382/145
[58] Field of Search ................................ 430/30; 382/145

[56] References Cited

U.S. PATENT DOCUMENTS 5,976,741  11/1999  Ziger et al. ................................ 430/30

FOREIGN PATENT DOCUMENTS 9-96908  4/1997  Japan .

OTHER PUBLICATIONS

Dammel, Ralph, "Diazonaphthoquinone–based Resists", 1993, pp. 10–12.

*Primary Examiner*—Christopher G. Young
*Attorney, Agent, or Firm*—Cooper & Dunham LLP

[57] ABSTRACT

A method of determining the amount of exposure is provided, in which a projection exposure is carried out onto a photoresist film using a photomask, having a plurality of openings with transmittance values different from one opening to the next stepwise, and through which light beams are irradiated for the exposure. Subsequently, the openings from which the photoresist is completely removed are observed and a lowest light transmittance value is found among the corresponding openings, to thereby the minimum amount of the exposure $E_{th}$ for removing the photoresist film is determined. The minimum amount of the projection exposure is found by exposing a plurality of portions with a single exposure step, and the determination of amount of the exposure becomes feasible with relative ease.

4 Claims, 4 Drawing Sheets

INITIATION OF
PHOTORESIST REMOVAL

COMPLETION OF
PHOTORESIST REMOVAL

METHOD OF DETERMINING THE AMOUNT OF PROJECTION EXPOSURE

BACKGROUND

1. Field

This patent specification relates to the fabrication of semiconductor devices and, more particularly, to a method of determining the minimum amount of the projection exposure and the rate of etching used in a fabrication process, and a photomask used for the projection exposure.

2. Description

In the fabrication of semiconductor devices such as, for example, IC's and LSI's, optical projection printing is commonly utilized in the lithography process. During the projection printing, various patterns previously formed on a reticle or photomask are transferred by projection exposure to a photoresist film on a semiconductor wafer either with or without magnification. Latent images formed by the exposure are then developed to thereby form a photoresist pattern on the wafer.

In order to carry out the projection exposure accurately for ever miniaturizing patterns, it is of primary importance that the lithography technique form a photoresist pattern without deteriorating minute features of the pattern, and it is particularly important to determine accurately the minimum amount of the projection exposure $E_{th}$ for removing the photoresist film (Japanese Laid-Open Patent Application No. 9-96908/1987).

As an example of a method for determining an appropriate exposure amount, a method has been used which is described hereinbelow by reference to FIG. 5.

FIG. 5 is a top view illustrating a resist pattern formed on the surface of a wafer 50. For use in determining an amount of the projection exposure, a glass reticle is used with a photoresist film disposed thereon without a pattern. Projection exposures are carried out onto a plurality of portions consecutively on the photoresist film, with an exposure time different stepwise from one portion to the next. In the present example shown in FIG. 5, 28 exposures are made one onto each of the portions arranged in a 7 by 4 matrix as shown. The exposure time for each portion is also shown in FIG. 5, which increases from 0.1 second to 0.235 seconds in steps of 0.005 seconds. The photoresist film is subsequently developed, to result in a series of portions, as illustrated in FIG. 6, ranging from the portion from which the photoresist is completely removed, to the ones in which a part of the photoresist remains, to the ones in which only a part of the photoresist is removed, and to the one from which none of the photoresist appears to be removed. The minimum amount of the projection exposure $E_{th}$ is subsequently determined from the shortest exposure time obtained by observing the portions from which the photoresist is completely removed.

However, this method has a disadvantage in that a plurality of exposure steps have to be made, which is rather cumbersome and takes a relatively long time. Furthermore, in order to determine the $E_{th}$ value during the device manufacturing processes, a downtime has to be allocated (1) for switching the reticles, in which a manufacturing reticle is removed from a step-and-repeat photolithographic system (or stepper) and a glass test reticle is mounted instead there into and (2) for rewriting a test program by reloading a new set of parameters such as, for example, an initial exposure time and the amount as mentioned above. This has been another disadvantageous point.

SUMMARY

It is therefore an object of this patent specification to provide a method and a photomask for determining the amount of exposure, which overcome the above-noted difficulties.

It is another object to provide a method of determining the amount of projection exposure and an etching rate, which is carried out with relative ease by exposing a plurality of portions by a single exposure step, and also provide a test or manufacturing photomask which may be used for carrying out projection exposure even onto a photoresist film having a thickness different over the surface area of a wafer.

To achieve the foregoing and other objects, and to overcome the shortcomings discussed above, a method of determining the amount of projection exposure is provided, in which a projection exposure is carried out onto a photoresist film using a photomask, having a plurality of openings with transmittance values different from one opening to the next stepwise, and through which light beams are irradiated for the exposure, followed by developing.

Subsequently, the openings from which the photoresist is completely removed are observed and a lowest light transmittance value is found among the corresponding openings, to thereby the minimum amount of the exposure $E_{th}$ for removing the photoresist film is determined.

The amount of the projection exposure is therefore found by exposing a plurality of portions with a single exposure step, and the determination of the amount of the exposure becomes feasible with relative ease.

According to another aspect of this specification, a method of obtaining an etching rate is provided, including the following steps.

A projection exposure is carried out onto a photoresist film using a photomask, having a plurality of openings with a transmittance value different from one opening to the next stepwise, and through which light beams are irradiated for the exposure, and the photoresist film is subsequently developed.

For a photoresist film portion without being etched and for another portion in which a part of the photoresist remains, thickness values $T_1$ and $T_2$ of the photoresist film are measured, respectively.

Subsequently, a next etching process is carried out using the photoresist pattern prepared as above, and the thickness values $T_3$ and $T_4$ are measured after this etching step, respectively, for the photoresist film and for the portion in which a part of the photoresist remained previously and a part of an underlying layer is now removed.

Etching rates $R_1$ and $R_2$ are then obtained for the photoresist film and the underlying layer, respectively, by calculating firstly the etching rate $R_1$ from the thickness values $T_1$ and $T_3$ measured as above; obtaining secondly the length of time for the removal of the $T_2$ thickness portion from the etching rate $R_1$ and the thickness value $T_2$ for the portion in which a part of the photoresist remained; thirdly obtaining the time for etching the $T_4$ thickness portion by subtracting the time for the removal of the $T_2$ thickness portion from the total etching time, and fourthly obtaining the time for etching the $T_4$ thickness portion from the thickness value $T_4$ for the portion in which a part of the underlying layer is removed by the etching, whereby the etching rate $R_2$ for the underlying layer is obtained.

The method described just above is advantageous to obtaining etching rates quantitatively during the actual manufacturing process as a process parameter for every lot of the quantity production.

According also to this method, the etching rate and various effects thereon may be observed qualitatively, in which the projection exposure and development of the photoresist film is firstly carried out using the photomask which has a plurality of openings with light transmittance values different from one opening to the next stepwise, and through which light beams are irradiated for exposure. The thus formed photoresist pattern following the etching is observed with respect to a stepwise change in color, for example, corresponding to the change in thickness of the underlying layer along the series of openings arranged on the wafer. This may be used for the qualitative determination of the etching rate over the wafer area, to thereby facilitate the control of etching process steps.

According to another aspect of this specification, a test photomask is provided, which has a plurality of openings with a transmittance value different from one opening to the next stepwise. The thus formed test photomask is advantageous over previous photomasks, in that the downtime is not necessary such as for the reticle switching from a manufacturing reticle to a test photomask, by once removing the former from a stepper and then mounting the latter to the stepper; and which a step of rewriting a test program by reloading a new set of parameters such as, for example, an initial exposure time and an amount of the stepwise increment.

According to another aspect of this specification, a manufacturing photomask is provided, which has also a plurality of openings with transmittance values different from one opening to the next stepwise and which is formed outside of a manufacturing pattern forming area. Using the thus prepared photomask, the amount of exposure may be determined even during actual manufacturing processes of the quantity production of semiconductor devices.

According to another aspect of this specification, a manufacturing photomask is provided, including a plurality of openings which are formed with different light transmittance values so that one of the light transmittance values for one opening is smaller, under which a thick photoresist film portion is to be located, and vice versa (i.e., a light transmittance value for another opening is larger, under which a thin photoresist film portion is to be located).

By the use of the thus formed manufacturing photomask, it is feasible to achieve exposure even onto a wafer in which the thickness of the photoresist film changes over the wafer surface, because of steps present across the wafer surface, including thick and thin portions, to thereby be able to obviate difficulties such an overexposure for the thin portion and undesirable decrease in the minute features of the resulting photoresist patterns.

BRIEF DESCRIPTION OF THE DRAWINGS

Preferred embodiments of the invention are described hereinbelow with reference to the drawings wherein.

DESCRIPTION OF THE ILLUSTRATIVE EMBODIMENTS

In the description which follows, specific embodiments useful in determining the amount of exposure and photomasks therefor, are described. It is understood, however, that the present disclosure is not limited to these embodiments. For example, it is appreciated that the photomask and a method of measurements therewith disclosed herein are also adaptable to any form of the measurements of stepwise exposure. Other embodiments will be apparent to those skilled in the art upon reading the following description.

Accordingly, a method and a photomask for use in the method are provided and are capable of determining the amount of projection exposure with an improved precision and with more ease.

Figure 1:
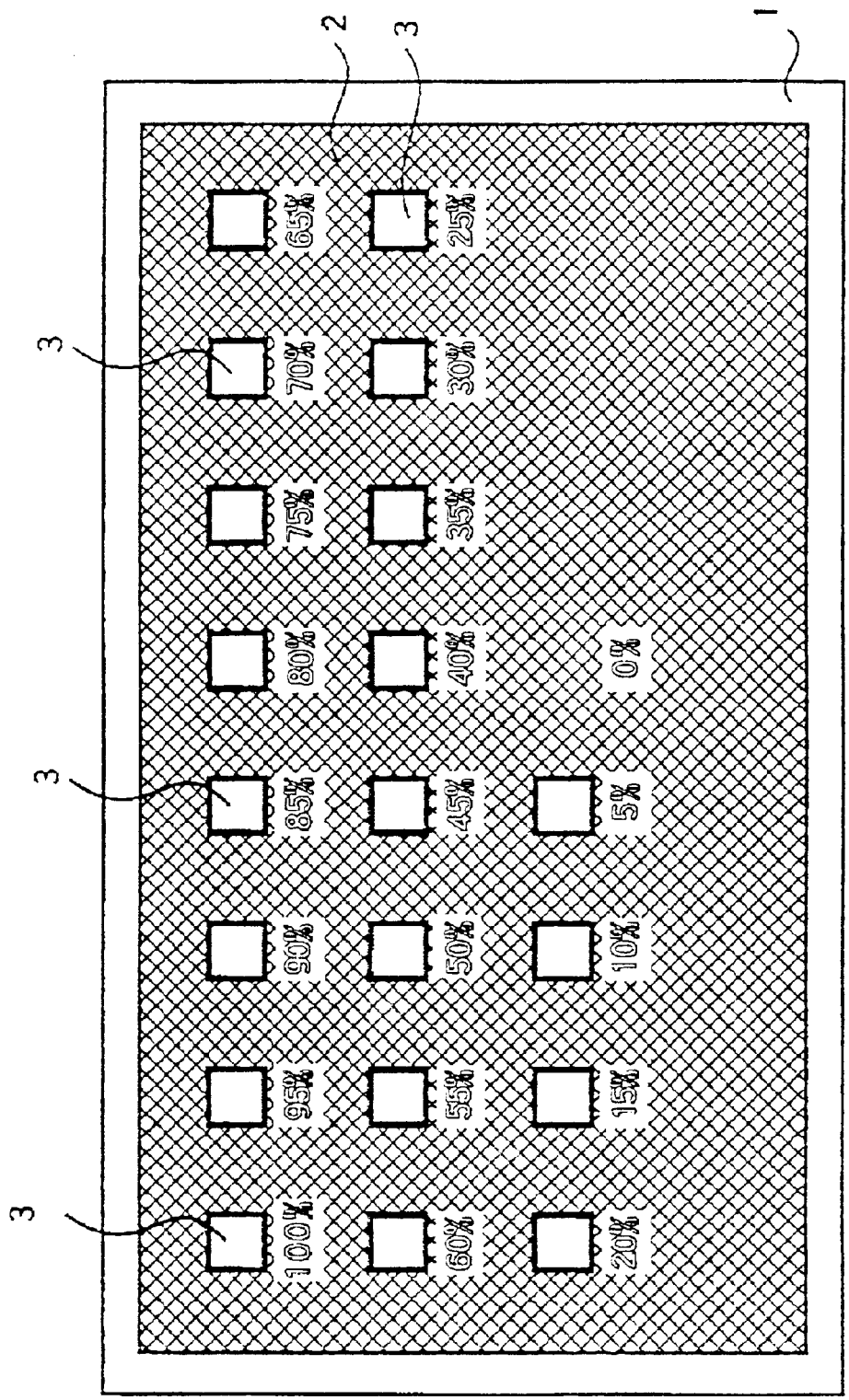
FIG. 1 is a top view illustrating a test reticle according to one embodiment disclosed herein, having a plurality of openings with a light transmittance value different from one opening to the next stepwise.

FIG. 1 is a top view illustrating a test reticle I according to one embodiment disclosed herein, having a plurality of openings which differ stepwise in a light transmittance value from one opening to the next.

Referring to FIG. 1, meshed portions 2 of the surface of the reticle 1 are opaque to light beams used for the exposure, which is generally formed by disposing a film of, for example, chromium.

The portions of the reticle 1 which carry the printed characters are each formed as a transparent portion (or in 100% transmittance) and the numbers are printed as a photoresist pattern.

Also in FIG. 1, there are shown a plurality of white square openings indicating minute windows 3, each of which is formed to have a different light transmittance. In the present embodiment, 20 windows are formed, having transmittance values which range from 100% to 5% by steps of 5%. The transmittance value of each window 3 is adjusted by appropriately selecting the kind, and the thickness, of the film material disposed in each window.

A method of determining the amount of exposure using a test reticle 1 will be described. A manufacturing reticle is removed from a stepper (not shown), and replaced by a test reticle. Subsequently, a center portion of a wafer is irradiated using the test reticle as a mask for the same exposure time as that for the manufacturing process. With this process, a sequence of 20 exposed portions 3 are formed, each being exposed with the amount of light corresponding to a transmittance value of each portion of the reticle. Then, the wafer is developed.

When a positive photoresist which is coated on the wafer is removed, there are portions of the wafer which correspond to window portions 3, ranging from the ones from which the photoresist is completely removed, to the ones in which at least a part of the photoresist remains. The ones from which the photoresist is completely removed are clearly observed with a microscope, so that a lowest light transmittance value can be found among the corresponding window portions. Since the amount of exposure to the photoresist through the opening 3 is determined by parameters such as (a) a light transmittance value, (b) the intensity of a light source (not shown) and (c) an exposure time which is the time during which a shutter is opened, the minimum amount of the exposure $E_{th}$ for removing the photoresist film can thereby be calculated.

Since the diameter of a wafer varies across its width, it is worth exposing not only center positions but also other surrounding portions of the wafer, to thereby be able to find whether there exists (a) an irregularity (or non-uniformity) in the thickness of the photoresist layer or (b) a scatter in the $E_{th}$ value which may be considered as an indication of possible uneven developing.

In addition, when the thus obtained $E_{th}$ value is fed back to the stepper, this facilitates proper light exposures in the succeeding processes using a manufacturing reticle.

Furthermore, if a difference is found in $E_{th}$ values between a center portion and a surrounding portion, several measurements may be prompted to confirm whether there is uniformity of the photoresist film thickness and/or irregularity during the developing process.

Although a test reticle is used in the present embodiment, a manufacturing reticle may be used alternatively, which is provided thereon with a manufacturing pattern of a semiconductor device as well. On the manufacturing wafer, a plurality of small openings are formed in a region of, for example, a scribe line on the wafer in a similar manner to the plurality of white square openings aforementioned as minute windows 3 illustrated in FIG. 1, each of which is formed to have a different light transmittance. With the thus formed manufacturing photomask, the control of the exposure amount and also of the photoresist film thickness becomes feasible even during actual semiconductor processes.

The light exposure during actual manufacturing processes is generally carried out using the manufacturing photomask with light several times as intense as the minimum amount $E_{th}$ (e.g., by a factor of from 1.4 to 2.4). Since light with such an intensity is transmitted through the openings, it is preferable that the aforementioned transmittance values be adjusted so that light with a proper intensity such as in the range of the $E_{th}$ value may irradiate the photoresist film.

Although a positive photoresist is used above for the exposure amount determination, a negative photoresist may alternatively be used, in which the etching processes are observed through a monitor by reversing the color thereof from black to white or vice versa.

Figure 2A:
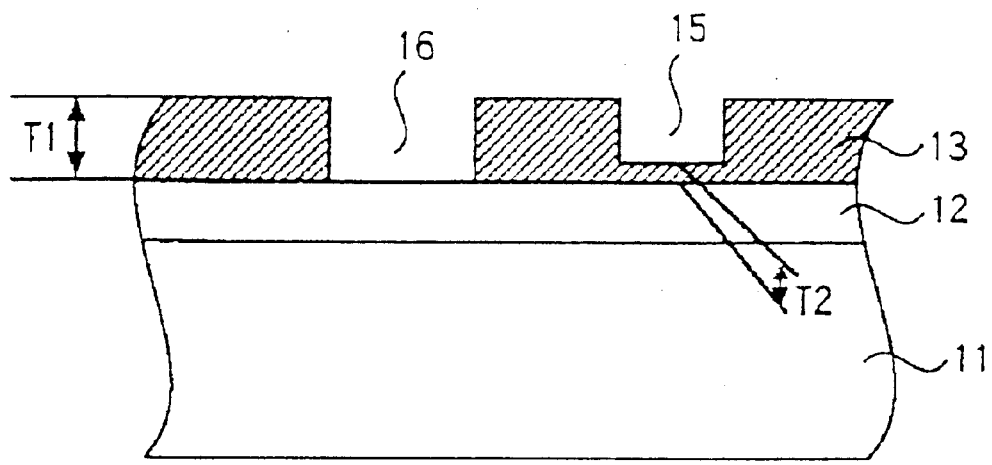
FIGS. 2A and 2B are cross sectional views illustrating a photoresist film with an underlying layer to be etched and a substrate wafer during various stages in the etching process according to one embodiment disclosed herein.
Figure 2B:
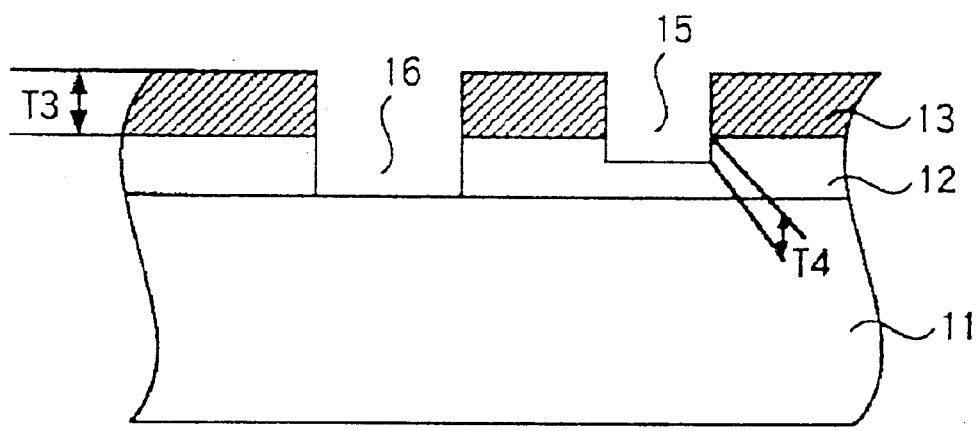

FIGS. 2A and 2B are cross sectional views illustrating a photoresist film 13 with an underlying layer 12 to be etched and a substrate wafer 11, during various stages in the etching process according to one embodiment disclosed herein.

Referring to FIGS. 2A and 2B, a method for obtaining an etching rate will be described. Although a test reticle is used to implement the method in this example, a manufacturing reticle such as the one aforementioned may alternatively be used.

By carrying out a light exposure using the reticle, followed by developing, an etched pattern is formed as illustrated in FIG. 2A, giving rise to a portion 16 from which the photoresist film 13 is completely removed and another portion 15 in which a part of the photoresist remains. Prior to a next etching step, in which the underlying layer 12 is to be etched, the thickness values $T_1$ and $T_2$ of the photoresist film portions are measured, respectively, for the photoresist layer portion 13 still covering the underlying layer 12 and for the portion 15 in which a part of the photoresist remains.

Subsequently, a next etching process is carried out using the photoresist pattern prepared as above, and the thickness values $T_3$ and $T_4$ are measured after this etching step, respectively, for the photoresist film 13 and for the portion 15 in which a part of the photoresist had remained previously and for which only a part of the layer 12 has been removed. The thickness values $T_4$ may be calculated alternatively from the thickness of the layer 12 prior to the etching subtracted by the thickness of the residual part thereof at the portion 15.

Etching rates $R_1$ and $R_2$ are then obtained as follows for the photoresist film 13 and the layer 12, respectively; (1) The etching rate $R_1$ is calculated from the thickness values $T_1$ and $T_3$ measured as above, (2) the length of time for the removal of the $T_2$ thickness portion is obtained from the etching rate $R_1$ and the thickness value $T_2$ for the portion 15 in which a part of the photoresist remained, (3) time for etching the $T_4$ thickness portion is obtained by subtracting the time for the removal of the $T_2$ thickness portion from the total etching time, and (4) time for etching the $T_4$ thickness portion is obtained from the thickness value $T_4$ for the portion 15 in which a part of the layer 12 is removed by the etching, whereby the etching rate $R_2$ is obtained.

The method described just above using either the test or manufacturing reticle is advantageous to obtaining the etching rate qualitatively during the actual manufacturing process as a process parameter for each lot of the quantity production.

The etching rate is generally affected by several parameters, and such etching rate characteristics will be described. It is noted that the etching characteristics may be utilized, in turn, as indicators to find parameters which are currently affecting the etching rate.

These characteristics may be determined by the following method, in which a light exposure is made with the aforementioned manufacturing reticle. By the light exposure, there results a resist pattern as illustrated in FIG. 2A, which includes a portion 16 from which the photoresist film 13 is completely removed and another portion 15 in which a part of the photoresist film 13 remains.

Although one portion is shown for each of the portions 15 and 16 in FIG. 2A, the total number of the portions is equal to that of aforementioned windows 3. In addition, the photoresist residue in each of the portions 15 will have a thickness different stepwise from one portion to another, corresponding to the transmittance value for each window.

By carrying out an etching step using the photoresist pattern as a mask, therefore, the thickness of the layer 12 after the etching has a thickness which differs stepwise from one portion to another, corresponding to the thickness of the residual photoresist film 13 at each window portion. Further, by observing the stepwise change such as that in color, for example, along the series of window portions arranged on the wafer, the change in etching rate over the wafer surface can be detected, to thereby facilitate the control of the etching process step.

Figure 3:
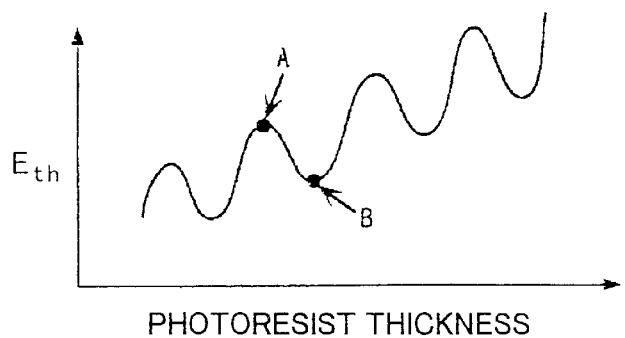
FIG. 3 contains a graph showing the relationship between the minimum amount of exposure $E_{th}$ and the thickness of the photoresist film.

It is known that a relationship exists between the minimum amount $E_{th}$ of the exposure and the thickness of the photoresist film, in which the former changes sinusoidally with the latter, as illustrated in FIG. 3.

Because of this relationship, the thickness has a larger margin with respect to the $E_{th}$ value at either the top (A in FIG. 3) or bottom (B) of the curve. The thickness of the photoresist film is generally adjusted approximately to the thickness corresponding to the point A or B; the former (point A) is preferred to the latter, for which a less standing wave effect is expected.

Figure 4:
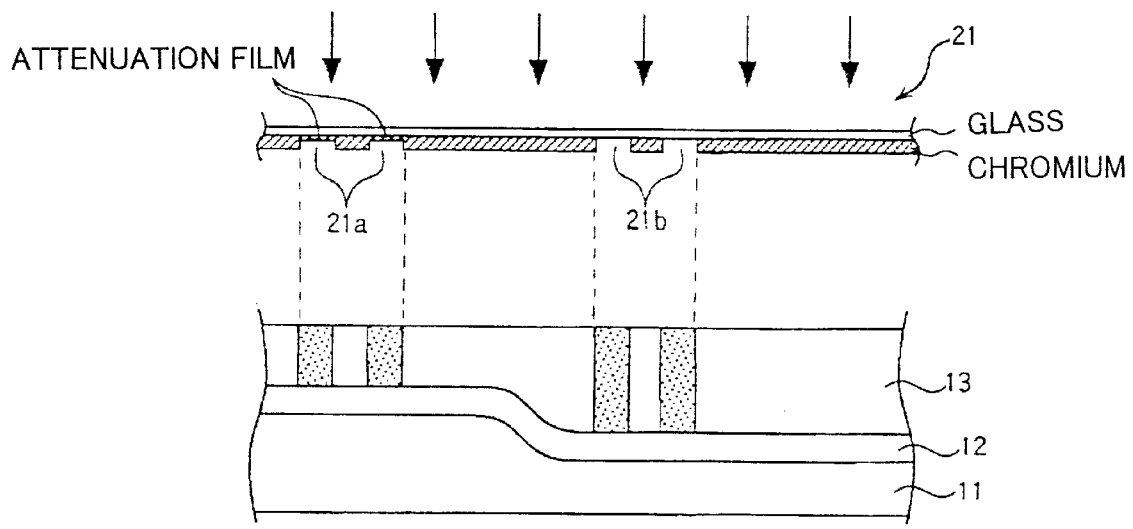
FIG. 4 illustrates a cross sectional view of a manufacturing reticle according to one embodiment disclosed herein, including a step across the wafer surface and light attenuation layers formed in some of opening portions of the reticle, in which the openings are on top of thin portions of a resist film.
Figure 5:
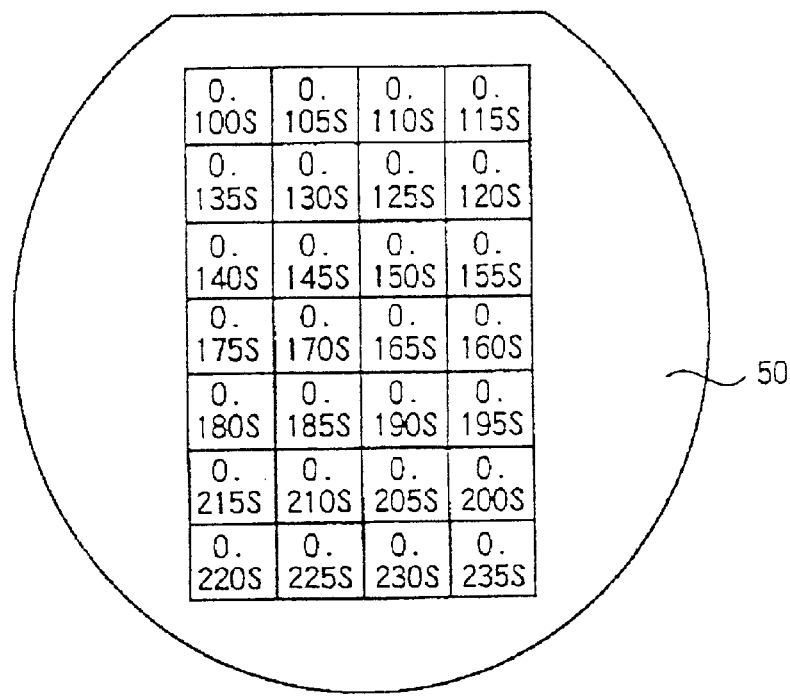
FIG. 5 is a top view illustrating a prior glass reticle, with which projection exposures carried out with an exposure time different stepwise from one portion to the next.

However, there exists another factor to be considered, in that the thickness of the photoresist film 13 may change over the wafer surface, because of steps previously formed cross the wafer surface, including thick and thin portions, as illustrated in FIG. 4. When the thick portion is adjusted to correspond to the aforementioned top (A) position and an exposure step is made, this may give rise to an overexposure for a thin portion, to thereby result in a difficulty such as an undesirable decrease in the features such as, for example, a line width of the resulting photoresist pattern.

In order to obviate this difficulty, a manufacturing reticle is prepared as follows. A couple of openings 21a and 21b (FIG. 4) are assumed to be provided in a pattern forming area on a manufacturing wafer, and the openings 21a and 21b are each located above the photoresist film portion, each being relatively small or large in thickness, respectively. Subsequently, a light transmittance value for the opening 21a is adjusted to be less than that for the opening 21b.

More specifically, this can be accomplished by further providing a light attenuating film 21 in the portion 21a to have a desired transmittance value in a similar manner to that for the aforementioned minute windows 3, in which each window is formed to have a different light transmittance.

By the use of the thus prepared manufacturing reticle, the aforementioned drawback can be obviated, such as an overexposure for a thin portion and an undesirable decrease in the minute features such as, for example, a line width of the resulting photoresist pattern.

Figure 6:
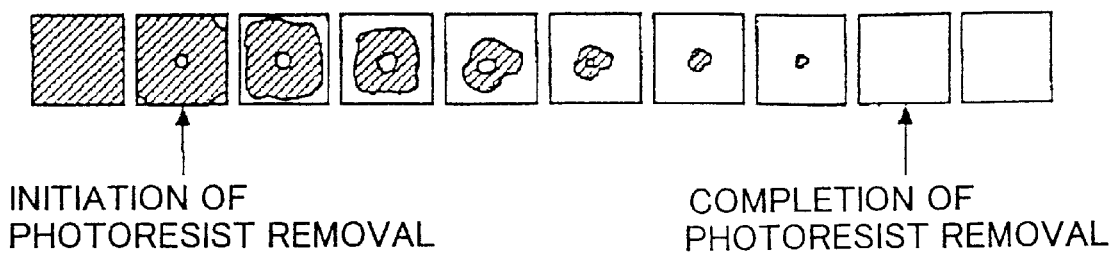
FIG. 6 is a top view illustrating a plurality of openings, illustrating stepwise from the initiation, to the completion, of the removal of a photoresist film in each opening.

The present invention thus improves on the method in which, a light intensity in the etching step is controlled by time, by observing a series of the residual photoresist patterns in the opening area as illustrated in FIG. 6, ranging stepwise from the initiation, to the completion, of the removal of the photoresist film in the window portions. The method disclosed herein is a vast improvement over the method mentioned just above, and is especially advantageous for use with wafers having an increased diameter which have been used recently and with the concurrently increasing exposure area on the wafer. In the present method, a plurality of minute openings such as shown in FIG. 1, may be provided on several reticles, to thereby facilitate control of the light intensity for the exposure over a wafer area with an improved accuracy. Furthermore, in order to control the etching process by time, the aforementioned printed characters (FIG. 1) may also be designated by the time length in place of the percentage light intensity.

As described hereinabove, by use of a photomask, having a plurality of openings with transmittance values which differ stepwise from one opening to the next, and through which light beams are irradiated for the projection exposure, the amount of the exposure is found for the plurality of opening portions with a single exposure step, and the determination of amount of the exposure becomes feasible with relative ease.

The method disclosed herein is advantageous to obtaining etching rates qualitatively during the actual manufacturing process as a process parameter for the lot of the quantity production.

The manufacturing photomask disclosed herein, may include a plurality of openings which are formed with different light transmittance values such that one of the light transmittance values for one opening is smaller, under which a thick photoresist film portion is to be located; and vice versa (i.e., a light transmittance value for another opening is larger, under which a thin photoresist film portion is to be located).

Furthermore, by the use of the manufacturing photomask disclosed herein, it is feasible to achieve exposures even onto a wafer in which the thickness of the photoresist film changes over the wafer surface, because of steps formed cross the wafer, including thick and thin portions, whereby a difficulty may be obviated such as an overexposure for the thin portion and undesirable decrease in the minute features of the resulting photoresist pattern.

This document claims priority and contains subject matter related to Japanese Patent Application 10-35777 (1998), filed with the Japanese Patent Office on Feb. 18, 1998, the entire contents of which are hereby incorporated by reference.

Additional modifications and variations of the embodiments disclosed herein are possible in light of the above teachings. It is therefore to be understood that within the scope of the appended claims, these embodiments may be practiced otherwise than as specifically described herein.

What is claimed is:

1. A method of determining the amount of a projection exposure, comprising the steps of:

providing a photomask, including a plurality of openings, wherein each of the plurality of openings differ stepwise in a light transmittance value from one opening to a next;

exposing a photoresist film provided on a wafer using said photomask;

developing said photoresist film;

observing some of said openings from which the photoresist film is completely removed;

identifying one of said openings which corresponds to a minimum amount of the exposure; and obtaining a minimum amount of the exposure $E_{th}$ for removing said photoresist film.

2. A method of determining an amount of a projection exposure, comprising steps of:

exposing a photoresist film through a photomask which includes a plurality of openings, wherein at least some of the openings differ stepwise in a light transmittance value;

developing the photoresist film to remove at least portions of the photoresist film;

observing said photoresist film to determine a relative amount of photoresist film removed from at least portions of the photoresist film exposed through the photomask; and determining, based on the relative amount of photoresist film removed, a desired amount of exposure for removing the photoresist film.

3. A method of determining an amount of a projection exposure as recited in claim 2, wherein the photoresist film is observed to determine from which portions the photoresist film has been completely removed.

4. A method of determining an amount of a projection exposure as recited in claim 3, wherein said determining step determines a minimum amount of exposure for removing the photoresist film.

* * * * *